(12) United States Patent
Tong et al.

(10) Patent No.: US 9,385,024 B2
(45) Date of Patent: Jul. 5, 2016

(54) ROOM TEMPERATURE METAL DIRECT BONDING

(71) Applicant: Ziptronix, Inc., Raleigh, NC (US)

(72) Inventors: Qin-Yi Tong, Durham, NC (US); Paul M. Enquist, Durham, NC (US); Anthony Scot Rose, Cary, NC (US)

(73) Assignee: ZIPTRONIX, INC., Morrisville, NC (US)

( * ) Notice: Subject to any disclaimer, the term of this patent is extended or adjusted under 35 U.S.C. 154(b) by 0 days.

(21) Appl. No.: 14/474,476

(22) Filed: Sep. 2, 2014

(65) Prior Publication Data

US 2014/0370658 A1    Dec. 18, 2014

Related U.S. Application Data

(60) Continuation of application No. 13/867,928, filed on Apr. 22, 2013, now Pat. No. 8,846,450, which is a continuation of application No. 12/913,385, filed on Oct. 27, 2010, now Pat. No. 8,524,533, which is a (Continued)

(51) Int. Cl.
*H01L 21/762* (2006.01)
*B23K 20/02* (2006.01)
(Continued)

(52) U.S. Cl.
CPC .......... *H01L 21/76251* (2013.01); *B23K 20/02* (2013.01); *H01L 21/481* (2013.01);
(Continued)

(58) Field of Classification Search
CPC ......... H01L 24/03; H01L 24/73; H01L 24/90; H01L 21/76251; H01L 21/187; H01L 21/185; H01L 24/11; H01L 24/12; H01L 24/16; H01L 24/81; H01L 24/83; H01L 24/32; H01L 24/28; H01L 24/80; H01L 24/10; H01L 24/26; H01L 21/481
See application file for complete search history.

(56) References Cited

U.S. PATENT DOCUMENTS 4,612,083 A    9/1986    Yasumoto et al.
4,818,728 A    4/1989    Rai et al.
(Continued)

FOREIGN PATENT DOCUMENTS

EP    0 465 227 A2    1/1992
JP    07-066093    3/1995
(Continued)

OTHER PUBLICATIONS

Tong et al., "Low Temperature Wafer Direct Bonding", Journal of Microelectomechanical Systems, vol. 3, No. 1, Mar. 1994, pp. 29-35.*

(Continued)

*Primary Examiner* — Stephen W Smoot
*Assistant Examiner* — Sun M Kim
(74) *Attorney, Agent, or Firm* — Knobbe, Martens, Olson & Bear LLP

(57) ABSTRACT

A bonded device structure including a first substrate having a first set of metallic bonding pads, preferably connected to a device or circuit, and having a first non-metallic region adjacent to the metallic bonding pads on the first substrate, a second substrate having a second set of metallic bonding pads aligned with the first set of metallic bonding pads, preferably connected to a device or circuit, and having a second non-metallic region adjacent to the metallic bonding pads on the second substrate, and a contact-bonded interface between the first and second set of metallic bonding pads formed by contact bonding of the first non-metallic region to the second non-metallic region. At least one of the first and second substrates may be elastically deformed.

16 Claims, 9 Drawing Sheets

Related U.S. Application Data continuation of application No. 11/758,386, filed on Jun. 5, 2007, now Pat. No. 7,842,540, which is a continuation of application No. 11/085,131, filed on Mar. 22, 2005, now Pat. No. 7,602,070, which is a division of application No. 10/359,608, filed on Feb. 7, 2003, now Pat. No. 6,962,835.

(51) Int. Cl.
*H01L 21/48* (2006.01)
*H01L 23/00* (2006.01)
*H01L 25/00* (2006.01)

(52) U.S. Cl.
CPC ............... *H01L 24/09* (2013.01); *H01L 24/11* (2013.01); *H01L 24/12* (2013.01); *H01L 24/16* (2013.01); *H01L 24/32* (2013.01); *H01L 24/73* (2013.01); *H01L 24/81* (2013.01); *H01L 24/83* (2013.01); *H01L 24/89* (2013.01); *H01L 24/90* (2013.01); *H01L 25/50* (2013.01); *H01L 24/28* (2013.01); *H01L 2224/13011* (2013.01); *H01L 2224/13099* (2013.01); *H01L 2224/13109* (2013.01); *H01L 2224/13144* (2013.01); *H01L 2224/13147* (2013.01); *H01L 2224/32145* (2013.01); *H01L 2224/80801* (2013.01); *H01L 2224/81011* (2013.01); *H01L 2224/81013* (2013.01); *H01L 2224/81014* (2013.01); *H01L 2224/8121* (2013.01); *H01L 2224/8183* (2013.01); *H01L 2224/81136* (2013.01); *H01L 2224/81143* (2013.01); *H01L 2224/81193* (2013.01); *H01L 2224/81208* (2013.01); *H01L 2224/81801* (2013.01); *H01L 2224/81815* (2013.01); *H01L 2224/81894* (2013.01); *H01L 2224/8319* (2013.01); *H01L 2224/8334* (2013.01); *H01L 2224/8383* (2013.01); *H01L 2224/8384* (2013.01); *H01L 2224/8385* (2013.01); *H01L 2224/83095* (2013.01); *H01L 2224/83801* (2013.01); *H01L 2224/83894* (2013.01); *H01L 2224/83895* (2013.01); *H01L 2224/83907* (2013.01); *H01L 2224/9202* (2013.01); *H01L 2225/06513* (2013.01); *H01L 2924/00013* (2013.01); *H01L 2924/01003* (2013.01); *H01L 2924/014* (2013.01); *H01L 2924/0105* (2013.01); *H01L 2924/01005* (2013.01); *H01L 2924/0106* (2013.01); *H01L 2924/01006* (2013.01); *H01L 2924/01013* (2013.01); *H01L 2924/01015* (2013.01); *H01L 2924/01018* (2013.01); *H01L 2924/01019* (2013.01); *H01L 2924/01022* (2013.01); *H01L 2924/01023* (2013.01); *H01L 2924/01027* (2013.01); *H01L 2924/01029* (2013.01); *H01L 2924/0132* (2013.01); *H01L 2924/01033* (2013.01); *H01L 2924/01039* (2013.01); *H01L 2924/01046* (2013.01); *H01L 2924/01047* (2013.01); *H01L 2924/01049* (2013.01); *H01L 2924/01072* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/07802* (2013.01); *H01L 2924/10329* (2013.01); *H01L 2924/12042* (2013.01); *H01L 2924/1305* (2013.01); *H01L 2924/14* (2013.01); *H01L 2924/1532* (2013.01); *H01L 2924/351* (2013.01); *Y10T 29/49126* (2015.01)

(56) References Cited

U.S. PATENT DOCUMENTS

| | | |
|---|---|---|
| 4,904,328 A | 2/1990 | Beecher et al. |
| 4,939,568 A | 7/1990 | Kato et al. |
| 4,998,665 A | 3/1991 | Hayashi |
| 5,087,585 A | 2/1992 | Hayashi |
| 5,322,593 A | 6/1994 | Hasegawa et al. |
| 5,419,806 A | 5/1995 | Huebner |
| 5,489,804 A | 2/1996 | Pasch |
| 5,501,003 A | 3/1996 | Bernstein |
| 5,504,376 A | 4/1996 | Sugahara et al. |
| 5,516,727 A | 5/1996 | Broom |
| 5,563,084 A | 10/1996 | Ramm et al. |
| 5,610,431 A | 3/1997 | Martin |
| 5,734,199 A | 3/1998 | Kawakita et al. |
| 5,753,536 A | 5/1998 | Suglyama et al. |
| 5,821,692 A | 10/1998 | Rogers et al. |
| 5,866,942 A | 2/1999 | Suzuki et al. |
| 5,985,739 A | 11/1999 | Plettner et al. |
| 5,998,808 A | 12/1999 | Matsushita |
| 6,008,126 A | 12/1999 | Leedy |
| 6,071,761 A | 6/2000 | Jacobs |
| 6,080,640 A * | 6/2000 | Gardner ............ H01L 21/76801 257/E21.576 |
| 6,218,203 B1 | 4/2001 | Khoury et al. |
| 6,232,150 B1 | 5/2001 | Lin et al. |
| 6,258,625 B1 | 7/2001 | Brofman et al. |
| 6,265,775 B1 | 7/2001 | Seyyedy |
| 6,297,072 B1 | 10/2001 | Tilmans et al. |
| 6,316,786 B1 | 11/2001 | Mueller et al. |
| 6,322,600 B1 | 11/2001 | Brewer et al. |
| 6,333,206 B1 | 12/2001 | Ito et al. |
| 6,374,770 B1 * | 4/2002 | Lee ....................... C23C 16/401 118/695 |
| 6,465,892 B1 | 10/2002 | Suga |
| 6,528,894 B1 | 3/2003 | Akram et al. |
| 6,552,436 B2 | 4/2003 | Burnette et al. |
| 6,555,917 B1 | 4/2003 | Heo |
| 6,579,744 B1 | 6/2003 | Jiang |
| 6,583,515 B1 | 6/2003 | James et al. |
| 6,589,813 B1 | 7/2003 | Park |
| 6,600,224 B1 | 7/2003 | Farquhar et al. |
| 6,624,003 B1 | 9/2003 | Rice |
| 6,627,814 B1 | 9/2003 | Stark |
| 6,642,081 B1 | 11/2003 | Patti |
| 6,656,826 B2 | 12/2003 | Ishimaru |
| 6,660,564 B2 | 12/2003 | Brady |
| 6,667,225 B2 | 12/2003 | Hau-Riege et al. |
| 6,828,686 B2 | 12/2004 | Park |
| 6,887,769 B2 | 5/2005 | Kellar et al. |
| 6,909,194 B2 | 6/2005 | Farnworth et al. |
| 7,078,811 B2 | 7/2006 | Suga |
| 7,109,063 B2 | 9/2006 | Jiang |
| 7,354,798 B2 | 4/2008 | Pogge et al. |
| 8,183,127 B2 | 5/2012 | Patti et al. |
| 8,241,961 B2 | 8/2012 | Kim et al. |
| 8,314,007 B2 | 11/2012 | Vaufredaz |
| 8,476,146 B2 | 7/2013 | Chen et al. |
| 2002/0000328 A1 | 1/2002 | Motomura et al. |
| 2002/0003307 A1 | 1/2002 | Suga |
| 2002/0074670 A1 | 6/2002 | Suga |
| 2002/0113241 A1 | 8/2002 | Kubota et al. |
| 2002/0173120 A1 | 11/2002 | Enquist |
| 2003/0092220 A1 | 5/2003 | Akram |
| 2003/0157748 A1 | 8/2003 | Kim et al. |
| 2004/0262772 A1 | 12/2004 | Ramanathan et al. |

FOREIGN PATENT DOCUMENTS

| | | |
|---|---|---|
| JP | H07-66093 | 3/1995 |
| JP | 2000-100679 | 4/2000 |
| JP | 2000-299379 | 10/2000 |
| JP | 2001-102479 | 4/2001 |
| JP | 2002-26123 | 1/2002 |
| JP | 2002-026123 | 1/2002 |
| JP | 2002-353416 | 12/2002 |

(56) References Cited

FOREIGN PATENT DOCUMENTS

| TW | 476145 | 2/2002 |
| WO | WO 01/61743 A1 | 8/2001 |
| WO | WO 03/054954 A2 | 7/2003 |

OTHER PUBLICATIONS

Office Action issued on Sep. 2, 2014 in the corresponding Japanese Patent Application No. 2012-090162 (with English Translation).
Amirfeiz et al., "Formation of silicon structures by plasma-activated wafer bonding," Journal of The Electrochemical Society, 2000, Vol, 147, No. 7, pp. 2693-2698.
Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1996, vol. 142, No, 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs-Si and InP-Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference On, pp. 272-275.
Howlader et al., "Characterization of the bonding strength and interface current of p—Si/ n—InP wafers bonded by surface activated bonding method at room temperature," Journal of Applied Physics. Mar. 1, 2002, vol. 91, No. 5, pp. 3062-3066.
Howlader et al., "Investigation of the bonding strength and interface current of p—SionGaAs wafers bonded by surface activated bonding at room temperature," J. Vac. Sci. Technol. B 19, Nov./Dec. 2001, pp. 2114-2118.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Matsuzawa et al., "Room-temperature interconnection of electroplated Au microbump by means of surface activated bonding method," Electronic Components and Technology Confererence, 2001, 51st Proceedings, IEEE, pp. 384-387.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.

(56) References Cited

OTHER PUBLICATIONS

Takagi et al., "Room silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al. "New Au—Al interconnect technology and its reliability by surface activated bonding,", Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
Aspar et al., "The smart-cut process: Status and developments," Proc. Electrochem. Soc., vol. 99-53, pp, 48 (1999).
Goesele et al., Proc. The Second Intl. Symposium on Semiconductor Wafer Bonding, The Electrochemical Soc. Proc., vol. 93-29, p. 395 (1993).
Hayashi et al, VLSI Tech. Dig. 95 (1990).
Hizukuri et al., "Flip-chip bonding of Au pump (100 μm Thick Al Pad with the Aid of 60 kHz ultrasonic vibration and 100 gf/fump of compressive load," Jpn. J. Appl. Phys. 40, 3044 (2001).
Iida et al., "The study of initial mechanism for Al—Au solid phase diffusion flip-chip bonding," Jpn. J. Appl. Phys. 36, 3655 (1997).
Li et al., "Low temperature copper to copper direct bonding," Jpn. J. Appl. Phys. 37, pp. L1068 (1998).
Schmidt, M.A., Proc. IEEE, vol. 86, No. 8, 1575 (1998).
Shimatsu et al., IEEE Tran. Magnet. 33, 3495 (1997).
Shimatsu et al., "Metal bonding during sputter film deposition," J. Vac. Sci, Technol. A 16(4), 2125 (1998).
Tsau et al., "Fabrication process and plasticity of gold—gold thermocompression bonds," Mater. Soc. Symp. Proc. 605, 171 (1999).
Yablonovitch et al., Pd layer as a bonding layer on GaAs wafers for bonding GaAs/GaAs at 200° C., Appl. Phys. Lett. 59, 3159 (1991).
"Handbook of Thin Film Technology," Maissel and Glang, 1983, Reissue, p. 12-24.
International Search Report, Mar. 1, 2005 (13 pages).
Tadaotomo Suga and Kenji Otsuka, Bump-less Interconnect for Next Generation System Packaging, The University of Tokyo, Research Center for Science and Technology, Tokyo, Japan, 2001 Electronic Components and Technology Conference, pp. 1-6.

T. Suga, Feasibility of Surface Activated Bonding for Ultra-fine Pitch Interconnection—A New Concept of Bump-less Direct Bonding for System Level Packaging, The University of Tokyo, Research Center for Science and Technology, 2000 Electronics Components and Technology Conference, pp. 702-708.
Akitsu Shigetou, Naoe Hosoda, Toshihiro Itoh and Tadatomo Suga, Room-Temperature Direct Bonding of CMP—Cu for Bumpless Interconnection, Research Center for Advanced Science and Technology, University of Tokyo, 2001 Electronic Components and Technology Conference, pp. 1-6.
A. Shigetou, T. Itoh, M. Matsuo, N. Hayasaka, K. Okumura and T. Suga, Cu—Cu Direct Bonding for Bump-Less Interconnect, Research Center for Advanced Science and Technolog, University of Tokyo, Optoelectronic Packaging and Solder Bumps, pp. 628-639.
Wikipedia, "Chemical bond", <URL http://en.wikipedia.org/wiki/chemical_bond, Accessed on Mar. 31, 2010, 10 pages.
Wikipedia, "Van der Waals force", <URL http://en.wikipedia.org/wiki/Van-der-Waals-force>, Accessed Mar. 31, 2010, 4 pages.
Qin-Yi Tong, et al., "Low Temperature Wafer Direct Bonding", Journal of Microelectromechanical Systems, IEEE Service Center, Piscataway, NJ, vol. 3, No. 1, Mar. 1, 1994, pp. 29-35, XP-000885425, ISSN 1057-7157.
Takemitsu Kunio, "Three Dimensional IC Technology, Using Cubic Method," Journal of the JWS, Japan Welding Society, Apr. 5, 1994, vol. 63 No. 3 pp. 185-189.
Shlgetou, A.; Hosoda, N.; Itoh, T.; Suga, T., Room-temperature direct bonding of CMP—Cu flm for bumpless Interconnection, Electronic Components and Technology Conference, 2001. Proceedings, $51^{st}$, U.S.A. IEEE, 2001, pp. 755-760.
A. Fan, A. Rahman, and R. Relf, Copper Water Bonding, Electrochem. Solid-State Lett, U.S.A. The Electrochemical Socity, Aug. 6, 1999, vol. 2, No. 10, pp. 534-536.
Petition for Inter Partes Review of U.S. Pat. No. 7,485,968 (pp. 1-49).
Declaration of Richard A. Blanchard in Support of Petition for Inter partes review of U.S. Pat. No. 7,485,968 (pp. 1-18).
Office Action mailed Dec. 17, 2013, in Japanese Patent Application 2012-090162, flied Feb. 6, 2004 (English Translation).
Canadian Office Action issued Aug. 1, 2013, in Patent Application No. 2,618,191.
Canadian Office Action, mailed May 16, 2012 for application No. 2,515,375, with international preliminary report.
Declaration of Richard A. Blanchard in Support of Petition for inter partes review of U.S. Pat. No. 7,485,968, dated Jun. 13, 2013, pp. 1-18.
Fan et al., "Copper water bonding," Electrochem. Solid-State Lett., U.S.A., The Electrochemical Society, Aug. 6, 1999, vol. 2, No. 10, pp. 534-536.
Japanese Office Action issued Feb. 8, 2011, in Patent Application No. 2006-502988 (submitting English translation only).
Japanese Office Action issued Oct. 11, 2011, in Patent Application No. 2006-502989 (English-language translation only).
Japanese Office Action mailed Jan. 8, 2013 for Japanese Patent Application No. 2006-502988 (English translation).
Japanese Office Action mailed May 8, 2012 in Japanese Patent Application No. 2006-502988.
Korean Office Action issued Nov. 9, 2011, in Patent Application No. 10-2005-7014526 (with English translation).
Korean Office Action mailed Apr. 13, 2012 (with English translation).
Korean Office Action mailed Jul. 11, 2012 for Korean Patent Application No. 10-2012-7003621.
Kunio, Takemitsu, "Three dimensional IC technology, using cubic method," Journal of the JWS, Japan Welding Society, Apr. 5, 1994, vol. 63, No. 3, pp. 185-189.
Office Action issued Nov. 10, 2010, in Korean Patent Application No. 10-2005-7014526 (submitting English translation only).
Office Action mailed Dec. 17, 2013, in Japanese Patent Application 2012-090162, filed Feb. 6, 2004 (English translation).
Petition for Inter Partes Review of U.S. Pat. No. 7,485,968, IPR 2013-00381, filed Jun. 21, 2013, pp. 1-49.
Shigetou et al., "Cu—Cu direct bonding for bump-less interconnect," Research Center for Advanced Science and Technolog., University of Tokyo, Optoelectronic Packaging and Solder Bumps, pp. 628-639.

(56) References Cited

OTHER PUBLICATIONS

Shigetou et al., "Room-temperature direct bonding of CMP-Cu for bumpless interconnection," Electronic Components and Technology Conference, 2001, Proceedings, 51st, U.S.A., IEEE, 2001, pp. 755-760.

Shigetou et al., "Room-temperature direct bonding of CMP—Cu for bumpless interconnection," Research Center for Advanced Science and Technology, University of Tokyo, 2001 Electronic Components and Technology Conference, pp. 1-6.

Suga et al., "Bump-less interconnect for next generation system packaging," The University of Tokyo, Research Center for Science and Technology, Tokyo, Japan, 2001 Electronic Components and Technology Coference, pp. 1-6.

Tong et al., "Low temperature wafer direct bonding," Journal of Microelectromechanical Systems, IEEE Service Center, Piscataway, NJ, vol. 3, No. 1, Mar. 1, 1994, pp. 29-35, XP-000885425, ISSN 1057-7157.

Wikipedia, "Chemical bond," URL http://en.wikipedia.org/wiki/chemical_bond, accessed on Mar. 31, 2010, 10 pages.

Wikipedia, "Van der Waals force," URL http://en.wikipedia.org/wiki/Van-der-Waals-force, accessed on Mar. 31, 2010, 4 pages.

* cited by examiner

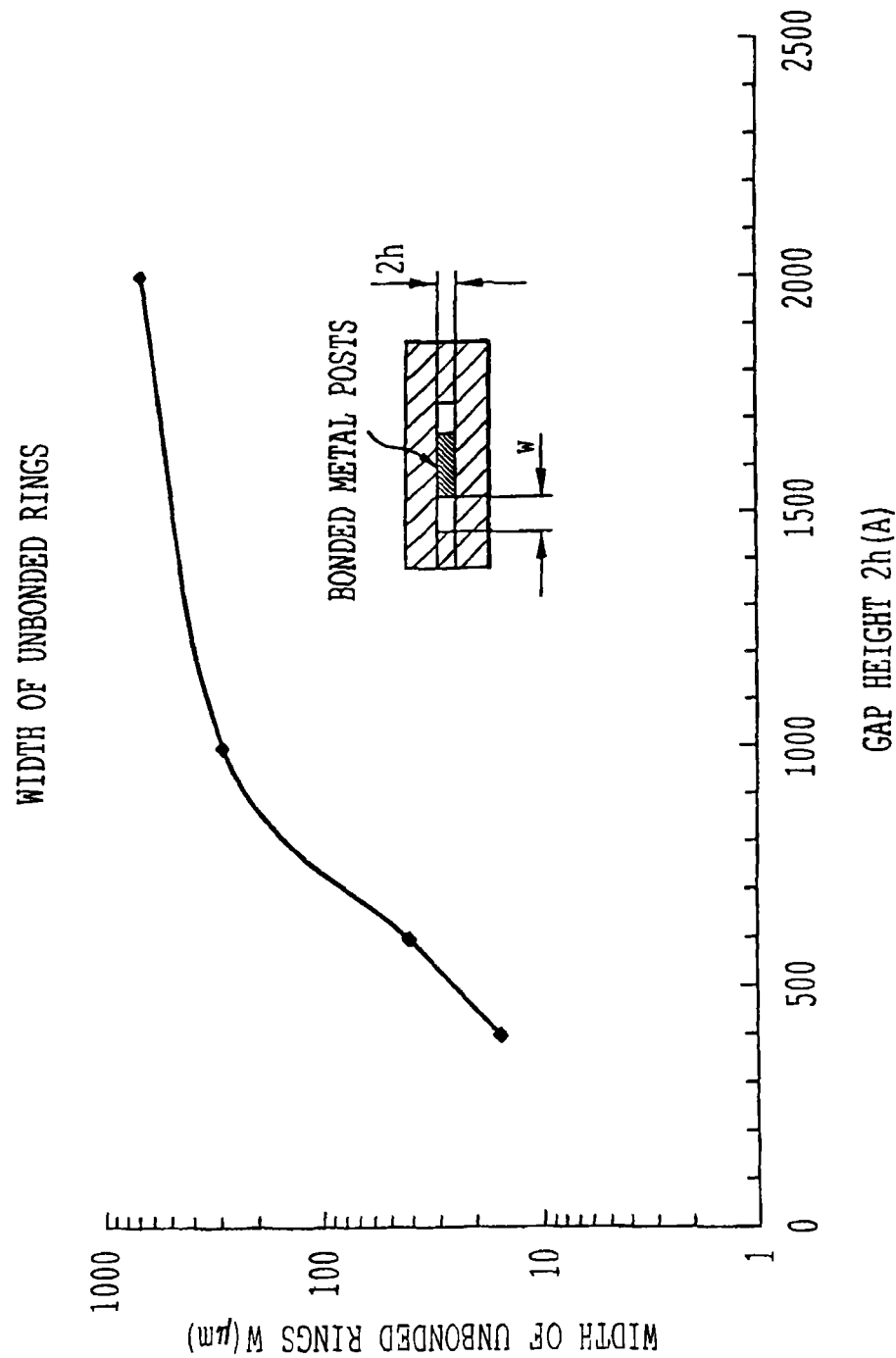

ROOM TEMPERATURE METAL DIRECT BONDING

CROSS-REFERENCE TO RELATED APPLICATIONS

This application is a continuation of application Ser. No. 13/867,928, filed Apr. 22, 2013, which is a continuation of Ser. No. 12/913,385, filed Oct. 27, 2010, now U.S. Pat. No. 8,524,533, which is a continuation Ser. No. 11/758,386, filed Jun. 5, 2007, now U.S. Pat. No. 7,842,540, which is a continuation of application Ser. No. 11/085,131, filed Mar. 22, 2005, now U.S. Pat. No. 7,602,070, which is a division of application Ser. No. 10/359,608, filed Feb. 7, 2003, now U.S. Pat. No. 6,962,835, which is related to application Ser. Nos. 09/410,054, 09/505,283 and 09/532,886, the entire contents of which are incorporated herein by reference.

BACKGROUND OF THE INVENTION

1. Field of the Invention

The present invention relates to the field of direct wafer bonding, preferably at room temperature, and more particularly to the bonding of substrates to be utilized in semiconductor device and integrated circuit fabrication.

2. Description of the Related Art

As the physical limits of conventional CMOS device are being approached and the demands for high performance electronic systems are imminent, system-on-a chip (SOC) is becoming a natural solution of the semiconductor industry. For system-on-a chip preparation, a variety of functions are required on a chip. While silicon technology is the mainstay technology for processing a large number devices, many of the desired circuit and optoelectronic functions can now best be obtained from individual devices and/or circuits fabricated in materials other than silicon. Hence, hybrid systems which integrate non-silicon based devices with silicon based devices offer the potential to provide unique SOC functions not available from pure silicon or pure non-silicon devices alone.

One method for heterogeneous device integration has been the hetero-epitaxial growth of dissimilar materials on silicon. To date, such hetero-epitaxial growth has realized a high density of defects in the hetero-epitaxial grown films, largely due to the mismatches in lattice constants between the non-silicon films and the substrate.

Another approach to heterogeneous device integration has been wafer bonding technology. However, wafer bonding of dissimilar materials having different thermal expansion coefficients at elevated temperature introduces thermal stresses that lead to dislocation generation, debonding, or cracking. Thus, low temperature bonding is desired. Low temperature bonding is also crucial for the bonding of dissimilar materials if the dissimilar materials include materials with low decomposition temperatures or temperature sensitive devices such as for example an InP heterojunction bipolar transistor or a processed Si device with ultrashallow source and drain profiles.

The design of processes needed to produce different functions on the same chip containing different materials is difficult and hard to optimize. Indeed, many of the resultant SOC chips (especially those at larger integration size) show a low yield. One approach has been to interconnect fully processed ICs by wafer adhesive bonding and layer transfer. See for example Y. Hayashi, S. Wada, K. Kajiyana, K. Oyama, R. Koh, S Takahashi and T. Kunio, *Symp. VLSI Tech. Dig.* 95 (1990) and U.S. Pat. No. 5,563,084, the entire contents of both references are incorporated herein by reference. However, wafer adhesive bonding usually operates at elevated temperatures and suffers from thermal stress, out-gassing, bubble formation and instability of the adhesive, leading to reduced yield in the process and poor reliability over time. Moreover, adhesive bond is usually not hermetic.

Wafer direct bonding is a technology that allows wafers to be bonded at room temperature without using any adhesive. The room temperature direct wafer bond is typically hermetic. It is not prone to introduce stress and inhomogeneity as in the adhesive bonding. Further, if the low temperature bonded wafer pairs can withstand a thinning process, when one wafer of a bonded pair is thinned to a thickness less than the respective critical value for the specific materials combination, the generation of misfit dislocations in the layer and sliding or cracking of the bonded pairs during subsequent thermal processing steps are avoided. See for example Q. —Y. Tong and U. Gösele, *Semiconductor Wafer Bonding: Science and Technology*, John Wiley & Sons, New York, (1999), the entire contents of which are incorporated herein by reference.

Moreover, wafer direct bonding and layer transfer is a VLSI (Very Large Scale Integration) compatible, highly flexible and manufacturable technology, using that to form stacking three-dimensional system-on-a chip (3-D SOC) is highly preferable. The 3-D SOC approach can be seen as the integration of existing integrated circuits to form a system on a chip.

Moreover, as the integration complexity grows, so do the demands on the integration process to robustly unify diverse circuits at low temperature, preferably at room temperature resulting in lower or non additional stress and more reliable circuits.

Low or room temperature direct wafer bonding of metal between wafers or die being bonded is desirable for 3D-SOC preparation because this can be used in conjunction with direct wafer bonding of non-metal between wafers or die to result in electrical interconnection between wafers or die being bonded when they are mechanically bonded and thus eliminate the need to for post-bond processing, like substrate thinning, via etching, and interconnect metalization, to achieve an electrical interconnection between bonded wafers or die. Very small bonding metal pads can be used resulting in very low parasitics and resulting reduced power and increased bandwidth capability.

Bonding of metals with clean surfaces is well-known phenomenon. For example, thermocompression wire bonding has been applied to wafer-level bonding. Temperature, pressure and low hardness metals are typically employed and usually results in residual stresses. For example, see example, M. A. Schmidt, Proc. IEEE, Vol. 86, No. 8, 1575 (1998), Y. Li, R. W. Bower, I. Bencuya, Jpn. J. Appl. Phys. Vol. 37, L1068 (1988). Direct bonding of Pd metal layer covered silicon or III V compound wafers at 250-350° C. has been reported by B. Aspar, E. Jalaguier, A. Mas, C. Locatelli, O. Rayssac, H. Moricean, S. Pocas, A. Papon, J. Michasud and M. Bruel, Electon. Lett., 35, 12 (1999). However, actually $Pd_2Si$ silicide or Pd-III V alloys, not metal Pd, are formed and bonded. Bonding of Au and Al at room temperature has been achieved by using ultrasonic and compressive load at flip chip bonding, see example, M. Hizukuri, N. Watanabe and T. Asano, Jpn. J. Appl. Phys. Vol. 40, 3044 (2001). Room temperature metal bonding at wafer level has been realized in ultrahigh vacuum (UHV) systems with a base pressure lower than $3 \times 10^{-8}$ mbar. Usually an ion argon sputtering or fast atom-beam is used to clean the bonding surfaces followed by application of an external pressure to the bonding substrates. See for example, T. Suga, Proc. The $2^{nd}$ Intl. Symposium on semiconductor wafer bonding, the Electrochemical Soc. Proc. Vol. 93-29, p. 71 (1993). Room temperature bonding between two Si substrates with thin sputtered Ti, Pt and Au films has also been accomplished using applied force after thin film sputter deposition at 4-40 µbar of Ar pressure in a UHV system with base pressure less than $3 \times 10^{-8}$ mbar. See for example, T. Shimatsu, R. H. Mollema, D. Monsma, E. G. Keim and J. C. Lodder, J. Vac. Sci. Technol. A 16(4), 2125 (1998).

SUMMARY OF THE INVENTION

An object of the present invention is thus to obtain mechanical and electrical contact between wafers and die with a single bonding step.

Another object of the present invention is to provide a low or room temperature bonding method by which metallic bonding between wafers or die of semiconductor circuits can be formed in ambient without using external pressure.

An additional object of the present invention is to provide a low or room temperature bonding method by which metallic bonding of layers of any metal between wafers or die of semiconductor circuits can be formed at room temperature at wafer level in ambient without using external pressure by covering metal layers with a thin film of gold or copper or palladium.

Still another object of the present invention is to provide a room temperature bonding method at wafer level in ambient without using external pressure by which metallic as well as covalent bonds are formed simultaneously at room temperature on bonding surfaces of wafers or die comprised of semiconductor circuits where metal and other non-metal layers co-exist.

Another object is to provide a room temperature bonding method by which different substrates or different materials on different substrates with different thermal expansion coefficients can be bonded together without generation of catastrophic stresses between the different substrates or different materials on different substrates.

Still another object of the present invention is a room temperature bonding method by which the bond strength between substrates approaches the mechanical fracture strength of the substrates.

Another object of the present invention is to provide a bonded device structure including devices fabricated individually on separate substrates and bonded on a common substrate.

A still further object of the present invention is to provide a method and device whereby a reliable mechanical bond can be formed at or near room temperature and a reliable electrical contact can be subsequently formed with a simple low temperature anneal.

These and other objects of the present invention are achieved by a bonded method and device structure including a first substrate having a first plurality of metallic bonding pads, preferably connected to a device or circuit, and having a first non-metallic region adjacent to the metallic bonding pads on the first substrate, a second substrate having a second plurality of metallic bonding pads, preferably connected to a second device or circuit, aligned or alignable with the first plurality of metallic bonding pads and having a second non-metallic region adjacent to the metallic bonding pads on the second substrate, and a contact-bonded interface between the first and second set of metallic bonding pads formed by either elastic deformation of elements within the first substrate and the second substrate that is a direct result of forces generated by direct wafer bonding of the first non-metallic region to the second non-metallic region, or by reflow of metal in the vicinity of the first and second sets of metallic bonding pads after direct wafer bonding of the first non-metallic region to the second non-metallic region.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein:

FIG. 2D is graph, according to the present invention showing the width of an unbonded ring area W as a function of the metal pad thickness 2h separating the semiconductor dies as shown in the insert;

DETAILED DESCRIPTION OF THE PREFERRED EMBODIMENTS

Figure 1A:
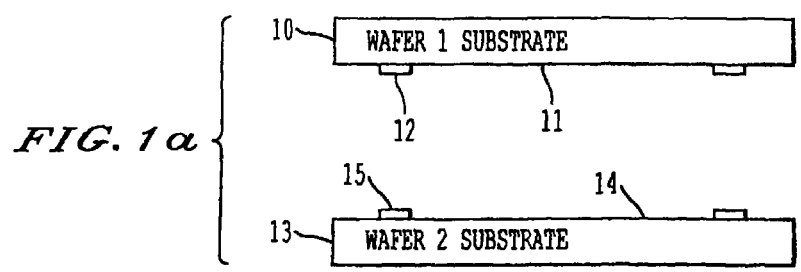
FIG. 1A is a schematic depiction of a pair of unbonded substrates having aligned metal bonding pads.

Referring now to the drawings, wherein like reference numerals designate like or corresponding parts throughout the several views, and more particularly to FIGS. 1A-1D and 2 illustrating a first embodiment of the bonding process of the present invention. In the first embodiment of the present invention, direct metal-metal bonding is generated when metal contact regions on separate wafers upon alignment are contact pressure bonded by the intrinsic forces generated when non-metallic regions peripheral to the metallic regions undergo room-temperature chemical bonding. Chemical bonding as used throughout this specification is defined as a bond strength developed when surface bonds on the surface of one wafer react with the surface bonds on the surface of an opposing wafer to form direct bonds across the surface elements, such as a covalent bond. Chemical bonds are manifest by their high bond strengths, approaching for instance the fracture strength of the wafer materials, and thus are differentiated for example from mere Van der Waals bonding. Examples of chemical bond strengths achieved by the methods of the present invention are discussed below. In the chemical bonding process, substantial forces are developed. These forces can be sufficiently great to elastically deform the metallic regions as the chemical bond propagates between the opposed non-metallic regions.

FIG. 1A shows two wafers 10, 13 with respective opposing wafer surfaces 11, 14. The wafer surfaces may be pure elemental semiconductor surfaces, may be pure elemental semiconductor surfaces including a relatively small amount of native oxide, or may be an insulator such as oxide-coated surface. The surfaces may be prepared as described in application Ser. Nos. 09/410,054, 09/505,283 and 09/532,886, to produce a smooth, activated surface. Techniques such as polishing or polishing and very slightly etching (VSE) may be used. A bonding layer may be deposited and polished or polished and slightly etched. The resulting surfaces are complementary and have chemical bonding surfaces that are planar and smooth, having chemical bonding surface roughness in the range of 5-15 Å, preferably no more than 10 Å, and more preferably no more than 5 Å.

Figure 1B:
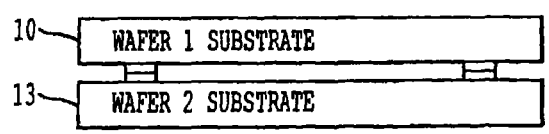
FIG. 1B is a schematic depiction of a pair of unbonded substrates having the aligned metal bonding pads contacted.
Figure 1C:
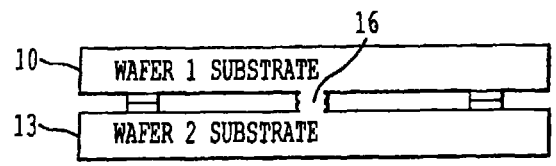
FIG. 1C is a schematic depiction of a pair of contacted substrates, according to the present invention, bonded in a non-metal region away from the metal bonding pads.
Figure 1D:
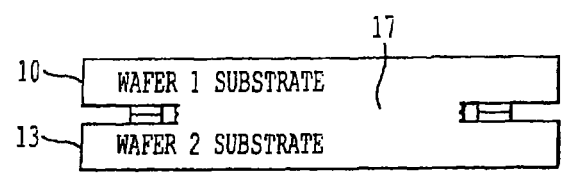
FIG. 1D is a schematic depiction of a pair of contacted substrates, according to the present invention, bonded across the non-metal regions except for a small unbonded ring area near the metal bonding pads.

Each wafer includes a set of metallic pads 12, 15 and a non-metallic region adjacent to the metallic bonding pads in the surfaces 11, 14. The non-planarity and surface roughness of the metallic bonding pads may be larger than that of the chemical bonding surfaces. Pads 12, 15 may be used to route electrical connections to the respective devices and/or circuits pre-fabricated on the wafers. The pads are preferably formed before surface treatment, and VSE is preferably performed after the pads are formed. As shown in FIG. 1A, pads 12, 15 are on the respective wafers are aligned. FIG. 1B shows the wafers upon placing the wafers together to contact the respective pads. At this stage, pads 12, 15 would be separable. In FIG. 1C, slight additional pressure is applied to the wafers to elastically deform one or both of the semiconductor wafers, resulting in contact between some of the non-metal areas on the wafers. The location shown of the contacting is an example, and the contact may occur at different locations. Also, the contact may occur at more than one point. This contact initiates chemical wafer-to-wafer bonding, and the bonded structure is shown in FIG. 1D. The bonding seam 16 expands after the initial chemical bonding to produce bonding seam 17 shown in FIG. 1D. The bond strength is initially weak and increases as the bonding propagates, as explained in Ser. Nos. 09/410,054, 09/505,283 and 09/532,886. The opposing non-metallic regions are chemically bonded at room or low temperature.

In more detail, as the wafer surfaces including the metal bonding pads contact at room temperature, the contacting non-metal parts of opposing wafer surfaces began to form a bond at the contact point or points, and the attractive bonding force between the wafers increases as the contact chemical bonding area increases. Without the presence of the metal pads, the wafers would bond across the entire wafer surface. According to the present invention, the presence of the metal pads, while interrupting the bonding seam between the opposing wafers, does not prohibit chemical wafer to wafer bonding. Due to the malleability and ductility of the metal bonding pads, the pressure generated by the chemical wafer-to-wafer bonding in the non-metal regions may results in a force by which nonplanar and/or rough regions on the metal pads may be deformed resulting in improved planarity and/or roughness of the metal pads and intimate contact between the metal pads. The pressure generated by the chemical bonding is sufficient to obviate the need for external pressure to be applied in order for these metal pads to be intimately contacted to each other. A strong metallic bond can be formed between the intimately contacted metal pads, even at room temperature, due to inter-diffusion or self-diffusion of metal atoms at the mating interface. This diffusion is thermodynamically driven to reduce the surface free energy and is enhanced for metals that typically have high inter-diffusion and/or self-diffusion coefficients. These high diffusion coefficients are a result of a cohesive energy that is typically mostly determined by the mobile free electron gas that is not disturbed by the motion of metal ions during the diffusion. The wafer-to-wafer chemical bonding in the non-metal regions thus effects electrical connection between metal pads on the two different wafers. The geometrical and mechanical constraints governing this effect are described below.

Figure 2A:
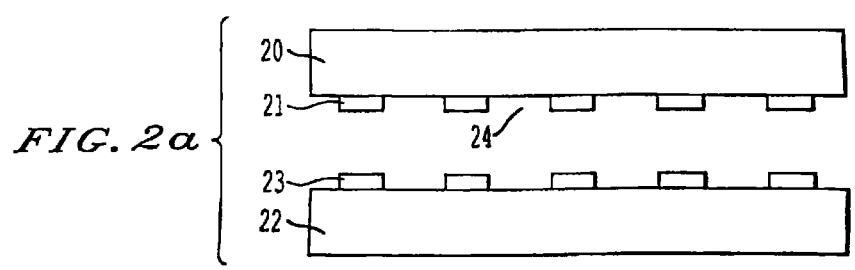
FIGS. 2A-2C are schematic diagrams illustrating bonding substrates with multiple bonding pads.
Figure 2B:
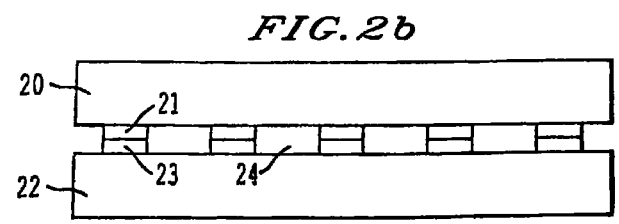
Figure 2C:
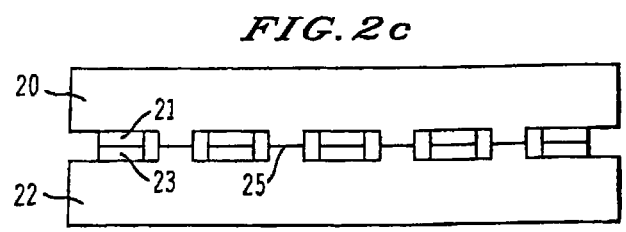

An unbonded area around the bonding pad having a width W will be generated in which the non-metal surfaces of the two wafers are precluded from contacting (see FIG. 1D). As long as the thickness of metal films is not too large, the gaps between two bonding wafers or dies can be reduced leaving a small unbonded area around each metal pad. This is illustrated in FIGS. 2A-2C, where wafer 20 with metal pads 21 is ready to be bonded to wafer 22 with pads 23. A gap 24 is between adjacent pads. The metal pads are contacted (FIG. 2B) and the wafers elastically deform to bond in the gaps 24 to form bonds 25 (FIG. 2C). It is noted that the dimensions in FIGS. 2A-2C are not to scale.

The formula to calculate the width of the unbonded area as a function of metal film thickness, mechanical properties of the wafer or die, the wafer or die thickness, the bonding energy will be shown below. FIG. 2D is a graph showing the relationship between the gap height 2h and the width w of an unbonded area. When the deformation of the wafers obeys an elastic constant given by Young's modulus E and the wafers each have a thickness of $t_w$, according to the simple theory of small deflection of a thin plate, the width W of the unbonded area can be roughly estimated by the following equation for $W > 2t_w$, where the metal bonding pads as a pair have a height of 2h above the wafer surface:

$$W = [(2E't_w^3)/(3\gamma)]^{1/4} h^{1/2} \quad (1)$$

where E' is given by $E/(1-v^2)$ with v being Poisson's ratio.

It has been suggested that with decreasing h, the situation changes drastically. See for example, U. Goesele and Q. —Y. Tong, Proc. The $2^{nd}$ Intl. Symposium on semiconductor wafer bonding, the Electrochemical Soc. Proc. Vol. 93-29, p. 395 (1993). If W calculated by Eq. (1) leads to values below $W_{crit} = 2t_w$, corresponding to $h < h_{crit}$ where $h_{crit} = 5(t_w \gamma/E')^{1/2}$, then an elastomechanical instability is supposed to occur, leading to an unbonded area with much smaller W that is independent of wafer thickness $t_w$, and is given by:

$$W \approx kh \quad (2)$$

where k is a dimensionless constant on the order of 1. Experimentally, as shown in FIG. 2D if h<300 Å, W is much smaller than what is predicted by Eq. (1). Further work by the inventors of the present application has shown that, if the spacing between metal bonding pad pairs 2R is smaller than 2W, the wafer pairs may not bond to each other. However, when 2R>2W, surfaces between the two unbonded areas around the metal posts will bond and the metal posts will be bonded and electrically connected.

The pressure P on the metal bonding pairs that is generated by the bonding of the surrounding area can be expressed as:

$$P = (16E't_w^3 h)/(3W^4) \quad (3)$$

Combining Eq. (3) with Eq. (1) or (2), when $W > 2 t_w$, the following is obtained:

$$P = 8\gamma/3h, \quad (4)$$

and when $W < 2 t_w$, the following is obtained:

$$P = (16E't_w^3)/(3k^4 h^3) \quad (5)$$

For bonded silicon wafers where the metal pads have height h of 500 Å and the bonding energy is 300 mJ/m², the compressive pressure on the metal bonding pads is about $1.6 \times 10^8$ dynes/cm², i.e. 160 atmospheres. Since this pressure is sufficiently high for metal bonding, there is no need to apply any external pressure during bonding. When metal height h is 300 Å or less, $W < 2t_w$ is satisfied and the pressure on the metal pairs is in the order of 5000 atmospheres if k=1 is assumed.

In one example of the first embodiment of the present invention, 5 mm diameter Au bonding pads with a thickness less than 300 Å and a separation distance of 1 mm were deposited on oxide covered 100 mm silicon wafers. Since the Au bonding pads were formed on the surface of the oxide, they also had a height of 300 Angstroms above the surface of the oxide. However, h can be much smaller than actual metal thickness since metal cam be partially buried in oxide or other insulator and h is the height the metal extended above the die surface. A room temperature bonding technology has been developed that cleans and activates the metal and the oxide surfaces compatibly and simultaneously. The Au posts formed a metallic bond by room temperature bonding at wafer level in ambient without using external pressure after storage in air for a period of time, e.g. 60 hr depending on the metal thickness and bonding energy. When the wafer pairs were forcibly separated, by inserting a wedge between the bonded interface, either the Au or the Au/oxide layer peeled from the silicon substrate, indicating that the metal-to-metal bond formed was stronger than the adhesion of the Au pad on the oxide surface or the oxide on the silicon surface. As mentioned above, a strong metallic bond can be formed between the intimately contacted metal pads at room temperature due to inter-diffusion or self-diffusion of metal atoms on the mating interface to reduce the surface free energy. The inter-diffusion or self-diffusion coefficient between metal atoms increases exponentially with temperature, in order to shorten the storage time to achieve full metallic bonding, annealing can be performed after room temperature bonding. The preferred annealing time for metallic bonding between the Au posts shortened as the temperature increased. For this case, 5 hr was preferred for 100° C., 1 hr for 150 EC, and 5 min for 250 EC. Thinner metals require lower temperatures for bonding than thicker metals due to higher pressure generated by the bonding of non-metal surrounding areas. The time for the formation of metallic bond at room temperature and at elevated temperatures becomes longer as the Au thickness (i.e., height) increases. For example, when the thickness of Au pads h is 600 Å, 5 min at 250° C. is needed to form metallic bond while at h=500 Å, 15 min is required.

In flip-chip bonding of state-of-the art integrated circuits, the solder ball pitch is about 1000 μm. Therefore, an unbonded area width around the bonded metal posts that is comparable or less than 1000 um is sufficiently small for practical applications. Unbonded area widths substantially less than this amount can be obtained by this method. For example, experimental results show that when h=200 Å, W is 20 μm, and when h=300 Å, W is 30 μm. Because h is the height the metal extended above the die surface, h can be much smaller than actual metal thickness since metal can be partially buried in oxide or other insulator, h less than 200 Å can be readily achieved. In this case the unbonded ring width around the metal pads can be close to zero. The metal pad described above may be formed by processes such as, but not limited to, sputtering, evaporation, laser ablation, chemical vapor deposition, and other techniques know to those skilled in the art in which thickness control in the <100 Angstrom range is typical.

Figure 3A:
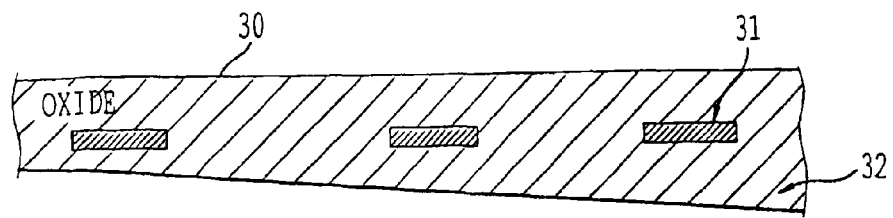
FIG. 3A is a schematic depiction of semiconductor die or wafer after surface planarization.
Figure 3B:
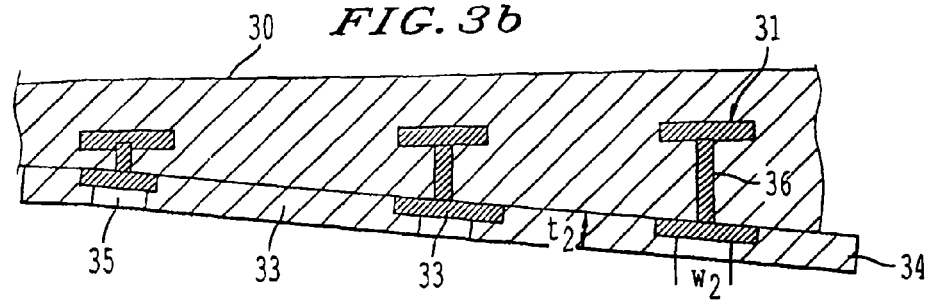
FIG. 3B is a schematic depiction of semiconductor die or wafer in which second metal layer are formed and planarized with contact windows opened on metal pads.
Figure 3C:
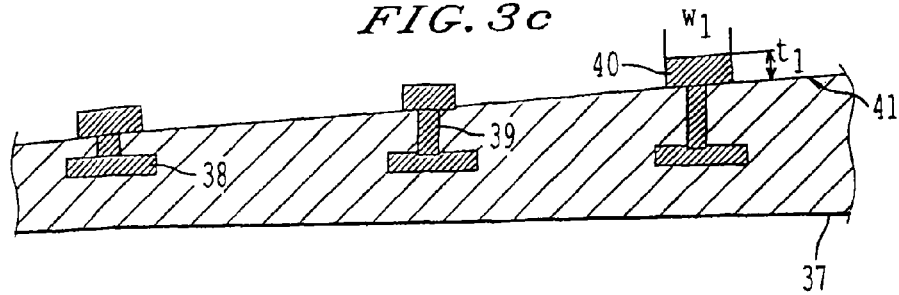
FIG. 3C is a schematic depiction of second semiconductor die or wafer with a second metal layer.

FIGS. 3A-3C are schematic drawings of a process according to a second embodiment of the present invention, by which two different fully processed dies are bonded. The dies are shown to have planar but uneven layer thickness, to demonstrate that the invention may be used in other instances other than even and planar layer thicknesses. In this process, as shown in FIG. 3A, a separate die 30 (only the oxide layer of die 30 is shown, for convenience of explanation) has metal pads 31. The die may be a silicon wafer including semiconductor devices and circuits have opposing surfaces of $SiO_2$. Surface 32 results after a CMP operation.

As shown in FIG. 3B, vias 36 have been formed and filled with metal to connect with metal pads 31, metal interconnects 33 are formed on wafer 30 to connect with the metal in vias 36, and a layer 34 of thickness $t_2$, of $SiO_2$ or other insulating material is formed on wafer 30. Portions 35 of the $SiO_2$ layer having a width $w_2$ have been removed to expose metal pads 35. The surface of layer 34 is treated as described in copending application Ser. Nos. 09/410,054, 09/505,283 and 09/532,886, including polishing or polishing and slightly etching.

Figure 3D:
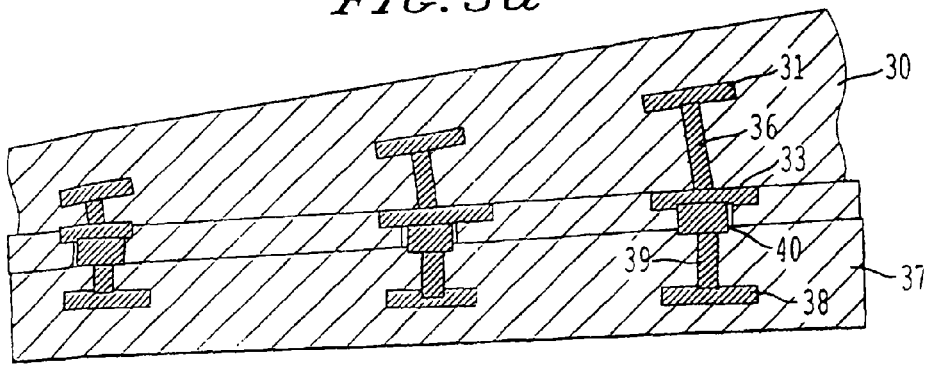
FIG. 3D is a schematic depiction of an aligned metal bonding of two dies or wafers, according to the present invention.

In FIG. 3C, a second wafer 37 has pads 38, vias 39 filled with metal, and interconnects 40 formed as shown. Interconnects 40 have a width $w_1$ and a height $t_1$. Surface 41 of wafer 37 has been treated like surface 32, as discussed above. The separate dies 30 and 37 are aligned and contacted one to another to produce the bonded structure shown in FIG. 3D. With the following relationships:

$$t_1 = t_2 + \delta_1 \text{ and } w_1 = w_2 + \delta_2,$$

where $t_1$ and $\delta_1$ are preferred to be the minimum thickness possible for the deposition technology used, and $\delta_2$ should be 2W corresponding to the case of $2h=t_1$. Compared with $h=t_1$ on both dies to be bonded, unbonded area width W is significantly reduced. Thus interconnection between the pads on wafers 30 and 37 is made. If $t_1$ on both dies is less than the critical thickness $h_{crit}$ then no layer 34 is required.

During the initial contacting of the two wafers at room temperature, the metal pads are aligned, and the surfaces of the wafers, according to the present invention, conform to each other by elastic deformation, provided the gap due to the surface topography of bonding wafers is sufficiently small and the bonding energy γ is sufficiently high. According to the present invention, direct bonding occurs between the contacted materials forming the metal interconnects between devices or circuits on adjoining dies and between the wafer surfaces. The bond begins to form on contact and the bond strength increases, at room temperature, to form a metallic bond.

As in the first embodiment, wafer surfaces 32 and 41 including metal pads 33 and 40 contact, the contacting non-metal parts of opposing wafer surfaces 32 and 41 began to form a bond at the contact points, and the bonding force increases as the contact bonding area increases. Without the presence of metal pads 33 and 40, the wafers would bond across the entire wafer surface. According to the present invention, the presence of metal pads 33 and 40, while interrupting the bonding seam between the opposing wafers, does not prohibit wafer to wafer bonding. Rather, the pressure generated by the wafer-to-wafer contact in the non-metal regions translates into a force by which metal pads 33 and 40 are contacted. No external pressure is required.

The method of the present invention can be carried out in ambient conditions rather than being restricted to high or ultra-high vacuum (UHV) conditions. Consequently, the method of the present invention is a low-cost, mass-production manufacturing technology. The size of metal films to be bonded is, according to the present invention, flexible and scalable to very small geometries because direct metallic bonding depends only on inter-molecular attraction force.

Direct metal bonding is preferable for better thermal management and power capability of semiconductor devices. The direct metal bonding, according to the present invention, can replace flip-chip bonding with much smaller bonding pads that are scalable. It is further possible that this metal bonding can be used to realize novel metal base devices (semiconductor-metal-semiconductor devices) see for example, T. Shimatsu, R. H. Mollema, D. Monsma, E. G. Keim and J. C. Lodder, IEEE Tran. Magnet. 33, 3495 (1997).

Further, the process is compatible with VLSI technology. The direct metal-to-metal bonding may be performed when wafers are fully processed. The direct metal-to-metal bonding of the present invention also utilizes room temperature bonding to minimize effects from the difference in thermal expansion, since almost all metals have significantly higher thermal expansion coefficients than silicon or silicon dioxide.

The present invention can bond locally or across an entire wafer surface area. The present invention, while not limited to the following examples, bonds heterogeneous surfaces such that metal/metal, oxide/oxide, semiconductor/semiconductor, semiconductor/oxide, and/or metal/oxide regions can be bonded between two wafers at room temperature.

Numerous advantages are offered by the present invention. For example, other methods of wafer bonding and electrically interconnected constituent electrical contacts require thinning of bonded substrates, via etching and metal deposition after wafer bonding. The present invention eliminates the need for these post-bond process steps to form electrical interconnections. Advantages of this elimination include the elimination of mechanical damage caused by the die thinning. Furthermore, the elimination of deep via etching avoids step coverage problems and allows the electrical connection to be scaled to smaller dimensions, resulting in an electrical interconnection with a smaller footprint and reduced electrical parasitics between bonded wafers. The method is compatible with other standard semiconductor processes, and is VLSI compatible.

As such, the present invention is compatible with 3-D SOC (three-dimensional system-on-a chip) fabrication. This vertical metal bonding of metal pads or interconnects using plugs between bonded dies significantly simplifies the SOC fabrication process and improves the SOC speed-power performance. The direct metal-to-metal bonding of the present invention is scalable and can be applied to multi-die stacking SOC.

Besides generation of the requisite force necessary to form metal-to-metal connections, the present invention recognizes that low resistance is desirable for the electrical interconnections from one device to another. Low resistance metal bonding is facilitated, according to the present invention, by oxide-free or nearly oxide-free surfaces of the metal bonding metal pads. For example, Au surface can be cleaned by ultraviolet/ozone and nitrogen plasma with no oxide left on the surfaces.

In another embodiment of the present invention, the surfaces of the bonding metal pads (fabricated for example from metals such as Al or Cu are coated with oxidation resistant metals, such as for example with gold (Au) or platinum (Pt) layer. Since both Au and Pt are inert metals, no oxide will be formed on the surfaces. To ensure that there is a minimum amount of oxide between Au or Pt and the host metal, sputter cleaning and evaporation deposition are employed, preferably immediately prior to the bonding process.

In a modification of the first embodiment of the present invention, a thin metal overcoat layer may be formed on the metal pad and bonded as described above. For example, a layer as thin as 50 Å of an Au layer on an Al pad produced successful metal pad bonding at room temperature. Therefore, metals such as Au can be used as a bonding layer, enabling almost all metals to be utilized for direct bonding at room temperature by the procedures of the present invention. When an insulator layer is deposed on a fully processed wafer and contact openings are formed on the metal pads followed by a metal deposition with thickness 100 Å more than the depth of the contact windows, the metal pads now are extended above oxide layer only 100 Å, the pads can be separated each other by a very small distance, e.g. 20 μm.

Besides Au or Pt, palladium (Pd) has been utilized in the present invention as an overcoat layer Pd has good oxidation resistance. The surface diffusivity of Pd on Pd is very high resulting in a significant mass transport of Pd even at room temperature, especially given the contacting pressures exerted on the metal bonding pads by the bonding of the non-metal wafer surface regions. The native oxide between the two Pd bonding layers, if any, will be mechanically dispersed allowing complete coverage with Pd of the physical interface between the two contacted metal bonding pads.

In another modification of the first embodiment of the present invention, a UV/ozone cleaning exposes the surfaces of the metal bonding pads to high ozone concentrations under a UV light to remove hydrocarbon contamination. Residual hydrocarbons on the surfaces of the metal bonding pads degrade metal bonding, and are nucleation sites for bubble formation between the bonding interfaces, resulting in outgassing between the contacted surfaces.

Experiments have shown that UV/ozone treatments can prevent interface bubble formation. An HF dip of silicon wafers leads to hydrophobic surfaces that are terminated mostly by H. The hydrophobic silicon wafers are treated with 4.77 g/m$^3$ of ozone concentration combined with 1850 Å and 2540 Å UV irradiation from two 235 W UV lamps at room temperature for 15 min. followed by a second HF dip and bonding. The bonded pairs of HF dipped hydrophobic silicon wafers generated no interface bubbles upon annealing from 300° C. to 700° C. for 15 hrs at each temperature clearly indicating the effective removal of hydrocarbons from the wafer surfaces.

For Au and Pt, it is adequate to use UV/ozone cleaning before bonding without formation of metal oxide on the metal surfaces. For other metals that can be oxidized by ozone, a thin layer of Au on the metals can prevent oxidation, or the oxide can be removed by e.g. immersion in $NH_4OH$ before bonding. In addition, plasma treatment with inert gases, for example plasma treatments in a reactive ion etch mode (RIE) with only inert gasses such as nitrogen and argon in the plasma chamber, can according to the present invention can clean metal surfaces and enhance the bonding energy at room temperature for both metal/metal and oxide/oxide bonds. Further, the present invention has discovered that an oxygen plasma can be used to remove contamination from the surface of metals such as Au and Pt.

Figure 4D:
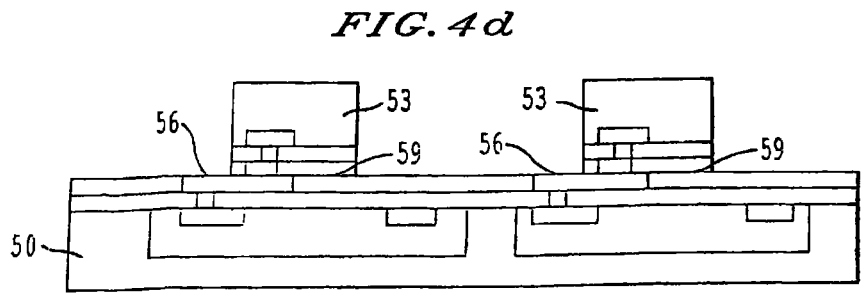
FIG. 4D is a schematic depiction of a pair of smaller substrates bonded to a larger substrate.
Figure 4A:
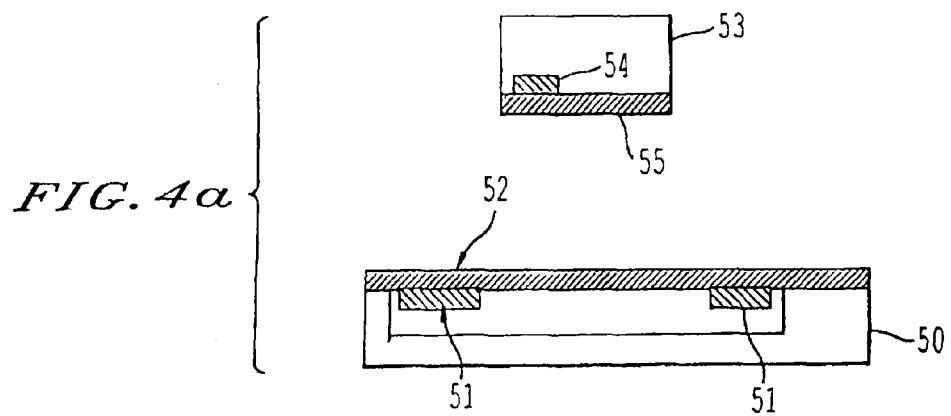
FIG. 4A is a schematic depiction of a part of a substrate showing imbedded metal pads in an oxide coating.
Figure 4B:
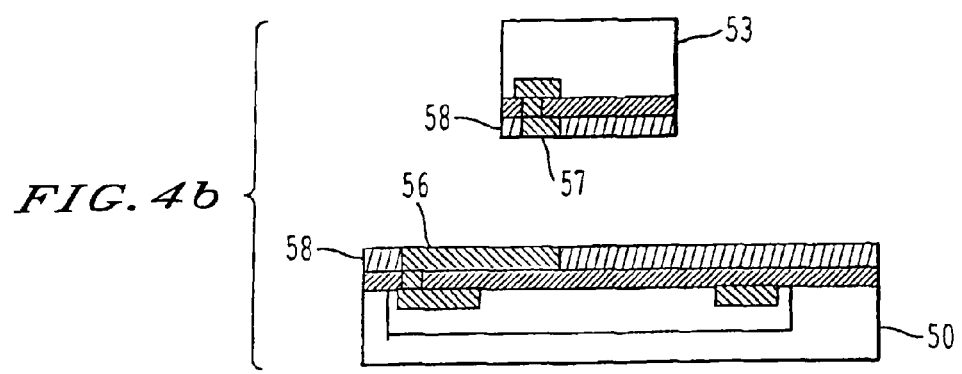
FIG. 4B is a schematic depiction of a pair of unbonded substrates, according to the present invention, having reciprocal metal bonding pads.
Figure 4C:
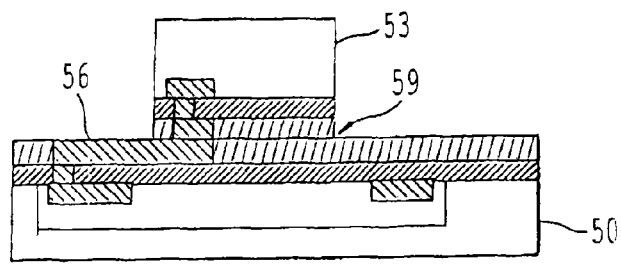
FIG. 4C is a schematic depiction of a pair of bonded substrates, according to the present invention, showing the reciprocal metal bonding pads contacted by the forces generated when the non-metal regions contacted and bonded.

While numerous surface preparation treatments and metal/metal and oxide/oxide and semiconductor/semiconductor examples have been described, other surfaces and preparation procedures could be used, according to the present invention, in which the corresponding metal, insulator, and semiconductor surfaces are sufficiently cleaned prior to contact such that the formation of room temperature bonding is not inhibited. In the case of Au protection or Au bonding, the process developed by the present invention is metal and silicon dioxide compatible. After CMP and surface planarization and smoothing of the oxide surfaces, metal bonding pads are formed on bonding wafers as described above, a modified RCA 1 ($H_2O:H_2O_2:NH_4OH=5:1:0.25$), UV/ozone, and plasma treatment clean the surfaces of both metal and oxide without roughening the bonding surfaces. A room temperature standard 29% $NH_4OH$ dip removes particles and oxide on the metal surfaces if any without degrading the silicon dioxide surfaces. After spin-drying and room temperature bonding and storage, strong covalent bond and metallic bond are formed spontaneously at bonding inter face between oxide layers and metal surfaces, respectively. Besides the near planar bonding structures shown in FIGS. 1A-1D, other structures can also utilize the principles of the present invention. For example, a second embodiment is shown in FIGS. 4A-4C, where wafers including metal via interconnections are bonded to a smaller die. FIG. 4A depicts a magnified view of a substrate 50 including metal interconnects 51. In FIG. 4A, the metal interconnects are embedded in a silicon dioxide layer 52 such as a PECVD oxide, thermal oxide, or spin-on glass. Interconnects 51 extend above the layer 52 to a height as discussed previously. FIG. 4A also shows smaller die 53 having metal contact 54 and silicon dioxide layer 55.

Following forming an insulating layer 58 on both dies of a material such as silicon dioxide, a standard via etch and metal fill, followed by chemical mechanical polish and surface treatment are used to prepare the layers 58 for bonding. FIG. 4B depicts a pair of opposing wafers with reciprocal metal bonding pads 56 and 57. FIG. 4C shows the contacting and subsequent bonding of these two opposing substrates, forming bond 59.

Here, as before, the bonding of the non-metal regions generates the requisite forces to form the metal-to-metal interconnections across the dies. As depicted in FIG. 4C, the bonding of the oxide layers generates the requisite bonding force for direct metal-to-metal contact of the metal bonding pads 56 and 57. A plurality of dies 53 may be prepared and bonded to die 60, as shown in FIG. 4D.

In the metal-to-metal direct bonding of the first and second embodiments of the present invention, the thickness of bonding metal films extended above die surface is preferably thin to minimize the unbonded ring area around the metal posts. Further, the thickness of bonding metal pads is scaleable, and VLSI compatible size metal posts or pads can be made and bonded. When the metal film thickness is below a certain value, the width of the unbonded ring area is significantly reduced so that the spacing between metal posts permits small spacing (e.g. <10 μm) between the metal bonding pads to be used.

A third embodiment of the invention allows a significant increase in the metal height above the non-metal surface and/or significant reduction in non-bonded area near the metal while maintaining an acceptable electrical connection between metal portions formed on separate wafers. In this embodiment, deformation of material in the vicinity of the metal material that forms the electrical contact is designed to result from the pressure at the metal surfaces from the wafer-to-wafer chemical bonding of the non-metal portions. This deformation may result in less pressure applied to the metal after the bonding process is complete, but adequate pressure to form an acceptable electrical connection between the metal portions. This deformation allows the gap near the metal surfaces to be significantly reduced or eliminated.

The object of the deformable material in the vicinity of the metal material forming the electrical contact is to allow the pressure generated by the chemical bonding of the non-metal surfaces to be sufficient to recess the metal material sufficiently into its respective surface so that the gap near the metal surface can be significantly reduced or eliminated. In general, the deformable material is comprised of non-metal portions because the pressure generated by the wafer-to-wafer chemical bonding is typically about one part in 10,000 or 1% of 1% of that required to deform typical metals. The recess of the metal into its respective surface allows the starting height of the metal surface above the non-metal surface to be substantially higher than after the recess. This significantly increases the tolerances of the metal surface required to prepare the wafers for bonding and subsequently the manufacturability of the embodiment. The deformation also substantially reduces or eliminates the non-bonded region around the metal allowing a substantial increase in the number of connections that can be made in a given area and increasing the bond strength of the bonded and interconnected parts.

Figure 5A:
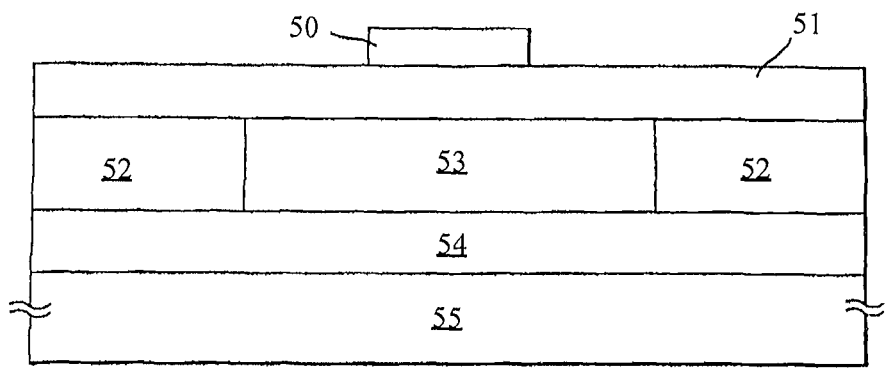
FIG. 5A is a schematic diagram of an embodiment of the invention having a deformable material or void beneath the metal pad.
Figure 5B:
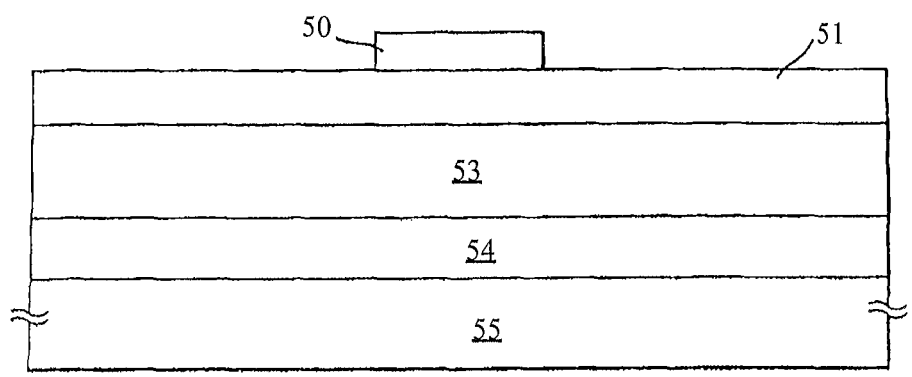
FIG. 5B is a schematic diagram of an embodiment of the invention having a deformable material beneath the metal pad.

The deformation is enabled by the inclusion of a non-metal region underneath the metal surface, as illustrated in FIG. 5A. A die with a substrate 55 has a metal pad 50 formed on a layer 51 that is to be bonded to a corresponding layer on another device. Region 53, filled with a deformable non-metal material such as a low K dielectric material, is formed in layer 52 by standard photolithography, etching and deposition techniques. Layer 52 and region 53 are formed on layer 54. Any number of layers may be formed on substrate 54. Also, region 53 may be much larger or layer 52 may be formed of the low K material, as shown in FIG. 5B.

Figure 5C:
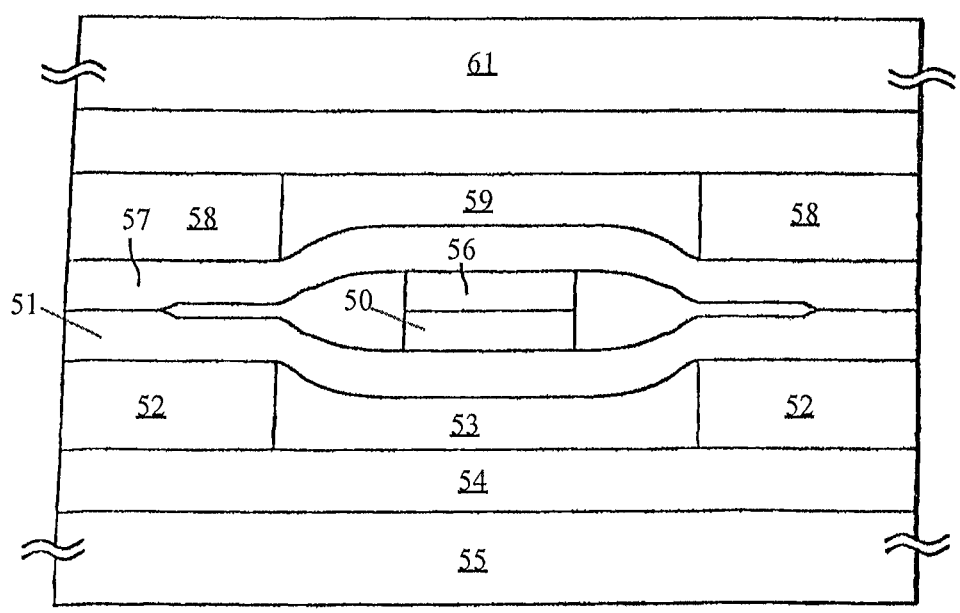
FIG. 5C is a schematic diagram of two devices as shown in FIG. 5A bonded together.

Region 53 may also be a void containing a vacuum or compressible gas like air, or it may be a compressible non-gas solid material with a sufficiently low compressibility that the pressure generated by the bonding will deform the metal into the region. The void may be formed in a manner similar to that used to fabricate metallic air bridges common in compound semiconductor integrated circuit fabrication. One example of this fabrication is as follows: 1) etch a recess in a planar, non-metal surface, 2) fill the recess with a removable material like photoresist such that the removable material is in the recess, but not outside the recess. This may, for example, be done by conventional spin coating of photoresist, resulting in a thicker photoresist in the recess than outside the recess, followed by blanket (non patterned) etching of the photoresist of an amount sufficient to remove the material outside the recess but not sufficient to remove the material in the recess, 3) patterning a metal feature that transverses the recess but does not entirely cover the recess, leaving an exposed portion of the recess, and 4) removal of the removal material in the recess by accessing the exposed portion of the recess. An example of a compressible non-gas solid material is a low K dielectric used in semiconductor manufacturing. The depth of this region is typically comparable to or greater than the desired height of metal above the non-metal surface. Another die to which the die of FIG. 5A is to be bonded may also have a region such as region 53 in a corresponding position beneath a metal pad to be bonded to pad 50. This is illustrated in FIG. 5C, where it is noted that FIG. 5C is a schematic drawing and is not shown to scale. Here, pads 50 and 56 are bonded by the compressive force generated by bonding of layers 51 and 57. The upper die in FIG. 5C includes a substrate 61 with pad 56 formed over void or low K material region 59 in layer 58. Layer 58 is formed on layer 59. Again, the upper die may have many layers.

In this embodiment, when the wafers are bonded, the metal surfaces are contacted and deformation with respect to each other occurs during the chemical bonding process. The deformation relieves some of the pressure applied by the bonding process, but sufficient pressure remains to maintain the metal surfaces in contact and maintain an acceptable minimum contact resistance between the two metal surfaces on the two separate wafers. As the metal deforms into the region under the metal, the bonding surfaces are allowed to come into contact in a lateral annulus very close or immediately adjacent to the metal, resulting in a maximum bonding area between the non-metal surfaces. A minimum chemical non-bonded region of 1-10 microns, or less, adjacent to the metal contact, can thus be formed by the present invention.

The deformable region is designed to have a minimum width to maximize the number of possible electrical interconnections. The deformable region width primarily depends on the metal thickness and the metal height above the non-metal surface. These parameters are approximately determined by the following relations.

$$\text{Stress} = (2/3) * (\text{Young's Modulus of Metal})(1/1-\text{Metal Poisson's Ratio}) * (\text{metal height above surface}/\text{half width of region})^2$$

and $$\text{Pressure} = \text{Stress} * 4 * \text{metal thickness} * \text{metal height above surface}/(\text{half width of region})^2$$

Where the pressure is that generated by the bonding process. A reference for these relations can be found in the "Handbook of Thin Film Technology", Maissel and Glang, 1983 Reissue, pp 12-24.

For example, for a metal thickness of about 0.1 micron and a metal height above the region of about 0.1 micron above the surface and a region width of about 1 micron, the pressure generated during bonding is approximately sufficient to deform the metal into the region (assuming compressibility of the region can be neglected). Note that this 0.1 micron metal height would have resulted in an unbonded annulus or ring width around the metal of about 1 mm if the metal was not deformable. The manufacturability is thus increased substantially by requiring less control of the metal height above the non-metal surface. Furthermore, the non-bonded area is substantially decreased allowing a significant increase in the number of metal to metal contacts that can be made and resulting in an increase in the chemical bonding energy. If the compressibility of the region can not be neglected, than the thickness of the metal needs to be reduced accordingly and/or the metal height above the non-metal surface needs to be reduced accordingly and/or the width of the region needs to be increased accordingly. Note that the percentage amount the width of the region needs to be increased is less than the percentage amount the metal height above the non-metal surface, or the metal thickness, needs to be reduced.

A fourth embodiment of the invention further relaxes the mechanical design constraints in the vicinity of the metal contacts described in the first, second, and third embodiments by relying on a low temperature, post-bond reflow anneal to form reliable electrical interconnections between chemically bonded wafers. A description of this embodiment is provided with reference to FIGS. 6A-C and 7A-C.

Figure 6A:
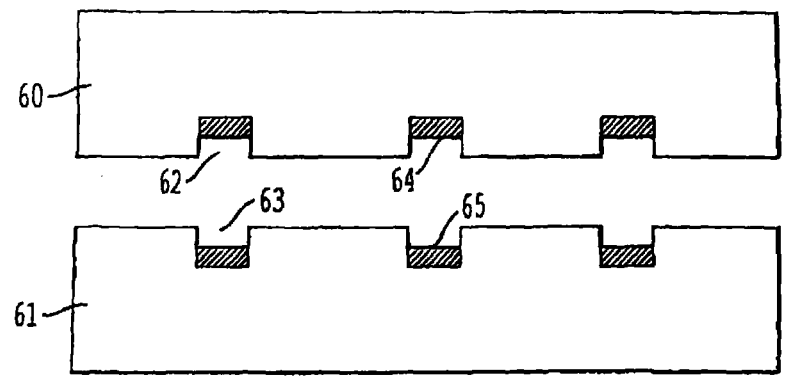
FIG. 6A is a schematic diagram of an embodiment of the invention having reflowable metal material exposed to the surface on two devices prior to direct wafer bonding of the non-metal surfaces.

FIG. 6A shows substrates 60 and 61 with planar surfaces. Recesses 62 and 63 are formed in substrates 60 and 61, respectively, and metal pads 64 and 65 are formed in recessed 62 and 63 respectively. The planar surfaces are suitable for chemical bonding as described previously. The metal or combination of metals making up pads 64 and 65 can reflow at low temperatures. Examples of such a metal is indium that reflows at a melting temperature of 160 degrees C., and such a combination of metals is 96.5% tin and 3.5% silver that reflows at a eutectic melting temperature of 220 degrees C.

After the surfaces in FIG. 6A are prepared for direct chemical bonding and the surfaces are placed together, a chemical bond is formed between the planar surfaces. Compared to embodiments 1 and 2, there is no gap near the metal contacts because the contacts are recessed, although a reliable electrical interconnection is not yet made.

Figure 6B:
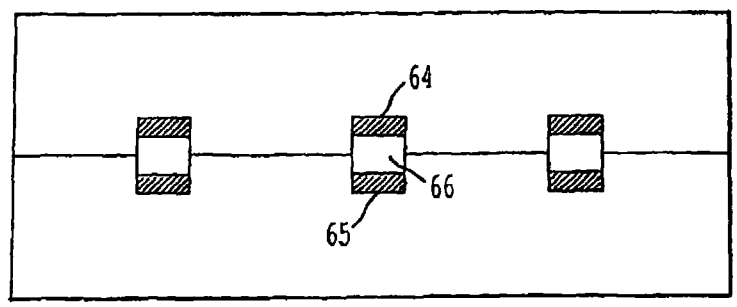
FIG. 6B is a schematic diagram of an embodiment of the invention having reflowable metal material sealed by after direct wafer bonding of the non-metal surfaces.
Figure 6C:
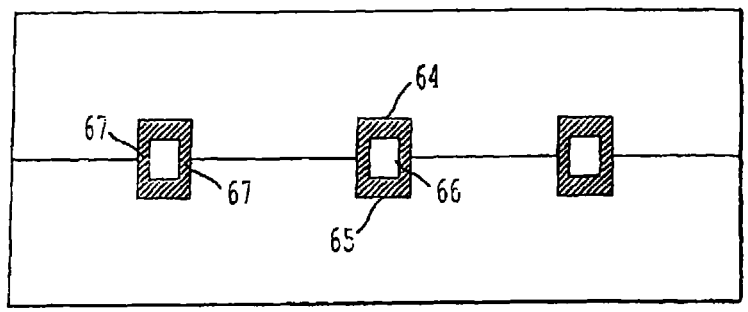
FIG. 6C is a schematic diagram of an embodiment of the invention having reflowable metal reflowed after direct wafer bonding of non-metal surfaces sealed the reflowable metal.

After the chemical bond in FIG. 6B has been formed, a void 66 is formed by partially metal-filled recesses from both wafers. This void does not impede the wafer surfaces from coming together and forming a chemical bond like the metal contacts do in the first and second embodiments. A maximum bond area is thus realized that maximizes the bond energy. After this high bond energy chemical bond has been formed, a low temperature reflow anneal reflows the metal in the recesses resulting in wetting of the metal from the opposing wafers together and resulting in an interconnected metal structure with high reliability. Portions 67 are formed by the reflow to connect pads 64 and 65. This reflow is assisted with a combination of capillary action for recesses with high aspect ratios and gravity as, for example, if the wafers are rotated during the anneal.

Figure 7A:
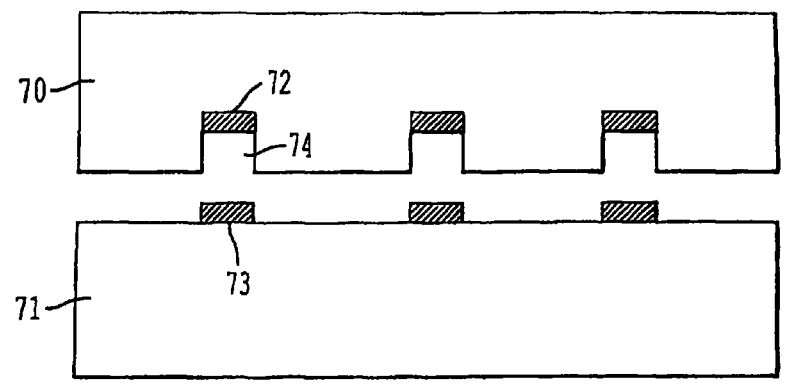
FIG. 7A is a schematic diagram of an embodiment of the invention having reflowable metal material exposed to the surface on two devices prior to direct wafer bonding of the non-metal surfaces.
Figure 7B:
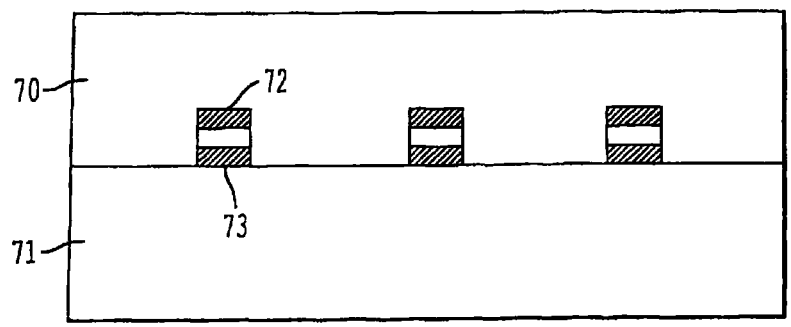
FIG. 7B is a schematic diagram of an embodiment of the invention having reflowable metal material sealed by after direct wafer bonding of the non-metal surfaces.
Figure 7C:
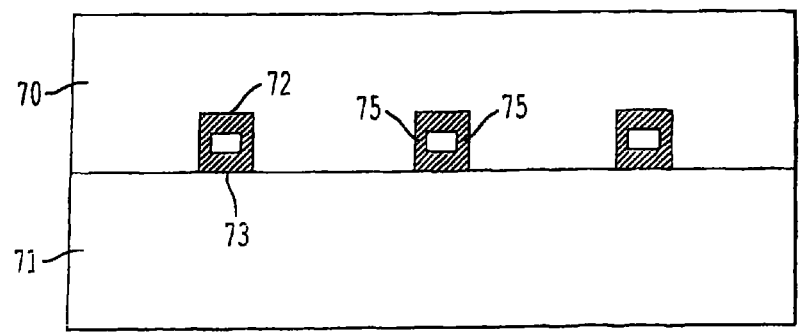
FIG. 7C is a schematic diagram of an embodiment of the invention having reflowable metal reflowed after direct wafer bonding of non-metal surfaces sealed the reflowable metal.

In a fifth embodiment, similar to the fourth embodiment, one of the surfaces in FIG. 6A has the metal recesses replaced with metal plateaus, such that the height of the metal plateau above the planar surface on one wafers is less than the depth of the metal recess below the planar surface on the other wafers as shown in FIG. 7A. Substrates 70 and 71 have respective metal pads 72 and 73. Pads 72 are formed in recesses 74. In this case, the metal surfaces do not, in general, touch after the planar surfaces forming a chemical bond are placed in contact as shown in FIG. 7B. The surfaces of substrates 70 and 71 are prepared for direct chemical bonding and the surfaces are placed together as in the above example, and a chemical bond is formed between the planar surfaces (FIG. 7B). After reflow, the metal on the two different wafers is wetted together, forming portions 75, in a manner similar to FIG. 6C, resulting in FIG. 7C.

Hence, the present invention offers numerous advantages and distinctions from prior low temperature wafer bonding techniques. The metal to metal direct bonding of the present invention is spontaneous and requires no external forces at room temperature. The pressure applied on the metal posts that is required for metal-to-metal bonding is generated by bonding process itself, and not external forces. The metal-to-metal direct bonding of the present invention is performed under ambient conditions and the following are realized: wafer level or die size bonds, strong metallic Au—Au, Cu—Cu or metal-to-metal bonds formed at room temperature, and strong metallic bond of metals other than Au and Cu can be formed at room temperature by covering the metals with a ~50 Å Au layer. Thus, simultaneous bonding of metal/metal, oxide/oxide and metal/oxide can be achieved. The metal-to-metal direct bonding of the present invention is compatible with standard VLSI processing and therefore, is a manufacturable technology. The metal to metal direct bonding of the present invention is compatible with bonding of materials covered with silicon oxides, silicon, or silicon nitride.

Facilitating the metal-to-metal direct bonding of the present invention is the direct bonding of the non-metal regions proximate to the metal bonding pads. As previously discussed, it is the direct bonding in these regions that generates the resultant force on the opposing metal bonding pads. The direct bonding of the non-metallic regions, according to the present invention, covalently bonds in air silicon dioxide or other insulator covered wafers. Other materials can be utilized, for example, fluorinated oxide surface layers that may also be dipped in an ammonia solution prior to bonding. More generically, any material with an open structure surface that can be terminated by OH, NH or FH groups, and porous low k materials when brought into contact at room temperature can form a covalent bond.

According to the present invention, silicon dioxide formed by any method such as deposition, thermally or chemically oxidation, and spin-on glass, can be used in pure or doped states.

Applications of the present invention include but are not limited to vertical integration of processed integrated circuits for 3-D SOC, micro-pad packaging, low-cost and high-performance replacement of flip chip bonding, wafer scale packaging, thermal management and unique device structures such as metal base devices.

Numerous modifications and variations of the present invention are possible in light of the above teachings. It is therefore to be understood that within the scope of the appended claims, the invention may be practiced otherwise than as specifically described herein.

The invention claimed is:

1. A bonding method, comprising:
forming a first plurality of metallic pads in a first insulating layer;
forming a second plurality of metallic pads in a second insulating layer;
polishing the first and second insulating layers having the first and second pluralities of metallic pads formed therein, respectively;
directly contacting the first insulating layer with the second insulating layer;
after directly contacting the first and second insulating layers, chemically bonding the first insulating layer to the second insulating layer without applying external pressure;
after directly contacting the first and second insulating layers, generating internal pressure, without applying external pressure, between the first plurality of metallic pads and the second plurality of metallic pads to form a contact between a first metallic pad of the first plurality of metallic pads and a second metallic pad of the second plurality of metallic pads.

2. The method as recited in claim 1, wherein at least one of the first and second insulating layers comprises a silicon oxide layer.

3. The method as recited in claim 2, comprising:
exposing the silicon oxide layer to one of an argon; nitrogen, and oxygen plasma.

4. The method as recited in claim 1, comprising:
exposing at least one of the first and second insulating layers to a plasma process.

5. The method as recited in claim 1, comprising:
exposing at least of one of the first and second insulating layers to one of an argon, nitrogen, and oxygen plasma.

6. The method as recited in claim 1, comprising:
polishing at least one of the first and second insulating layers to a surface roughness less than 15 angstroms.

7. The method as recited in claim 1, comprising:
forming said first and second insulating layers to have planar upper surfaces; and
forming said first and second metallic pads to have planar upper surfaces below the substantially planar upper surfaces of said first and second insulating layers.

8. The method as recited in claim 1, comprising:
bonding the first insulating layer to the second insulating layer in ambient.

9. The method as recited in claim 1, comprising:
bonding the first insulating layer to the second insulating layer at room temperature.

10. The method as recited in claim 1, wherein at least one of the first and second insulating layers comprises a silicon nitride layer.

11. The method as recited in claim 1, comprising:
forming a plurality of metallic vias respectively connected to the first plurality of metallic pads.

12. The method as recited in claim 1, comprising:
cleaning upper surfaces of the first and second plurality of metallic pads.

13. The method as recited in claim 1, comprising:
forming the first metallic pad to have an area different than an area of the second metallic pad.

14. The method as recited in claim 1, comprising:
bonding the first insulating layer to the second insulating layer such that a perimeter of the first metallic pad is within a perimeter of the second metallic pad.

15. The method recited in claim 1, comprising:
forming one of a palladium layer and a gold layer on at least one of the first and second metallic pads.

16. The method recited in claim 1, further comprising:
heating in a range of 100-250° C.

* * * * *